United States Patent [19]
Wetzel

[11] Patent Number: 5,757,196
[45] Date of Patent: May 26, 1998

[54] CAPACITIVE SWITCH ACTUATED BY CHANGES IN A SENSOR CAPACITANCE

[75] Inventor: Gustav Wetzel, Lörrach, Germany

[73] Assignee: Endress + Hauser GmbH + Co., Maulburg, Germany

[21] Appl. No.: 721,217

[22] Filed: Sep. 26, 1996

[30] Foreign Application Priority Data

Sep. 28, 1995 [DE] Germany .................. 195 36 198.9

[51] Int. Cl.⁶ .................. G01R 27/26; H03K 17/955
[52] U.S. Cl. .................. 324/688; 324/681; 307/116; 340/562; 361/181
[58] Field of Search .................. 324/663, 664, 324/667, 674, 681, 683, 686, 688; 307/116; 340/551, 562; 361/179, 181, 284; 73/304 C

[56] References Cited

U.S. PATENT DOCUMENTS

| | | | |
|---|---|---|---|
| 3,743,865 | 7/1973 | Riechmann | 307/116 |
| 3,764,819 | 10/1973 | Muller | 307/116 |
| 3,870,948 | 3/1975 | Holt et al. | 340/551 |
| 4,219,740 | 8/1980 | Little | 307/116 |
| 4,879,474 | 11/1989 | LaMarche | 307/116 |
| 5,367,198 | 11/1994 | Buergel et al. | 340/551 |

FOREIGN PATENT DOCUMENTS

| | | |
|---|---|---|
| 0 049 793 | 4/1982 | European Pat. Off. |
| 0 461 550 | 12/1991 | European Pat. Off. |
| 27 44 785 | 4/1979 | Germany |
| 42 38 992 | 5/1994 | Germany |
| 94 14 164 | 1/1995 | Germany |
| 2 005 422 | 4/1979 | United Kingdom |

*Primary Examiner*—Ernest F. Karlsen
*Assistant Examiner*—Diep Do
*Attorney, Agent, or Firm*—Bose McKinney & Evans

[57] ABSTRACT

A capacitive proximity or limit switch comprises a capacitive probe having a sensor electrode and a guard electrode. The sensor electrode is connected to an oscillator formed by a feedback system of two operational amplifiers, of which one operational amplifier is configured as a differential amplifier, the other operational amplifier as a voltage follower. The probe electrode is connected to the inverting input of the differential amplifier, in the feedback circuit of which a capacitor is provided, as a result of which the AC gain is determined. An adjustable portion of the output voltage of the differential amplifier is applied to the non-inverting input of the voltage follower, the output of which is connected to the non-inverting input of the differential amplifier to which the guard electrode is connected. As a result of this, the start and stop of oscillation of the oscillator is determined by variations of the capacitance of the sensor electrode, and the guard electrode is always maintained precisely at the same AC potential as the sensor electrode.

3 Claims, 1 Drawing Sheet

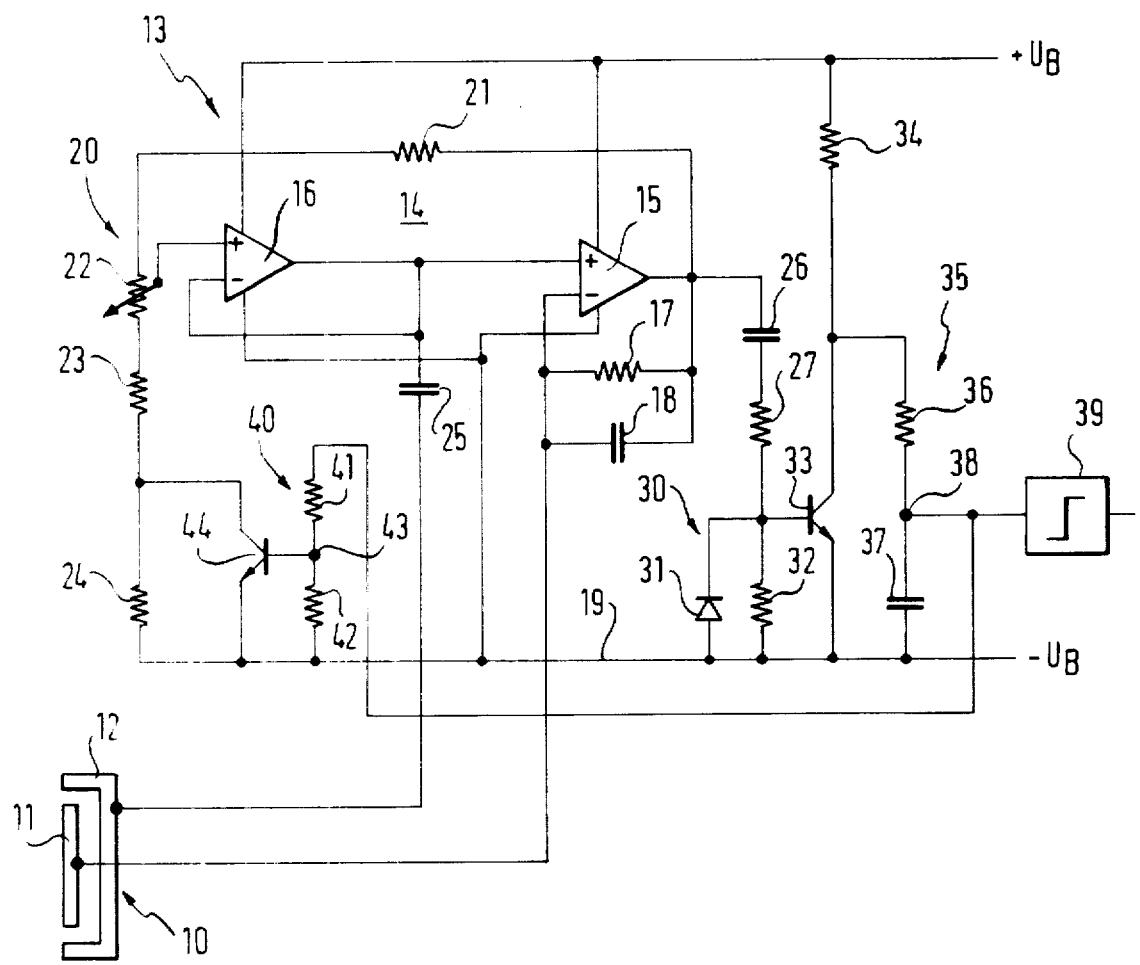

CAPACITIVE SWITCH ACTUATED BY CHANGES IN A SENSOR CAPACITANCE

BACKGROUND OF THE INVENTION

1. Field of the Invention

The invention relates to a capacitive switch comprising a capacitive probe having a sensor electrode and a guard electrode, and further comprising an electronic assembly containing an oscillator formed by a feedback system of two amplifiers, the sensor electrode being connected to one of the amplifiers so that start and end of oscillation of the oscillator are determined by changes of the capacitance of the sensor electrode, and the guard electrode being connected to an amplifier output in such a way that amplitude and phase of the AC voltage applied to the guard electrode agree with that of the AC voltage applied to the sensor electrode.

Capacitive switches of this kind are employed for example as proximity switches or as limit switches for monitoring a predetermined level in a container. In the case of a proximity switch the capacitance dictating the start and end of oscillation of the sensor electrode is influenced by an object coming into the vicinity of the capacitive probe. In the case of a capacitive level limit switch the capacitance of the sensor electrode depends on whether the probe is covered by the material in the container or not. The oscillator is set so that it will not oscillate when no object is in the vicinity of the probe or when the probe is not covered by the material and that oscillation commences when the capacitance of the sensor electrode exceeds a critcal value due to an object coming into the vicinity or due to it being covered by the material, and oscillation will cease when the capacitance of the sensor electrode decreases below a critical value. Start and end of oscillation are detected by an evaluation circuit and is made use of to trigger display or switching actions.

The guard electrode which is always maintained at the same AC potential as the sensor electrode prevents disturbance factors such as soilage and the formation of deposits from having an effect on the capacitance of the sensor electrode and thus on start and end of oscillation of the oscillator.

2. Description of the Prior Art

In the case of a capacitive switch of this kind known from DE 27 44 785 B2 the two amplifiers forming the oscillator are simple transistor stages, the sensor electrode being connected to the base of the transistor of the first transistor stage. To obtain the voltage applied to the guard electrode, a third transistor stage is added which is configured as an emitter follower and is connected to the oscillator so that it furnishes at its low impedance emitter output an AC voltage having essentially the same phase and amplitude as that of the AC voltage applied to the sensor electrode. The guard electrode is connected to this low impedance emitter output.

SUMMARY OF THE INVENTION

The object of the invention is to provide a capacitive switch which is sensitive to very small changes in capacitance, the response of which is adjustable very accurately and in which the guard electrode can be connected directly to a low impedance output of the oscillator.

In accordance with the invention this object is achieved in that the oscillator is formed by two operational amplifiers, that the first operational amplifier is configured as a differential amplifier, the inverting input of which is connected to the sensor electrode and the feedback circuit of which leading from the output to the inverting input contains a capacitor in parallel with a high impedance resistor, that the second operational amplifier is configured as a voltage follower and receives at its non-inverting input a portion of the output voltage of the first operational amplifier set by means of an adjustable voltage divider, that the output of the second operational amplifier is connected to the non-inverting input of the first operational amplifier, and that the guard electrode is joined to the connection between the output of the second operational amplifier and the non-inverting input of the first operational amplifier.

In the case of the capacitive switch according to the invention the guard electrode is connected to the non-inverting input of an operational amplifier, to the inverting input of which the sensor electrode is connected. Since an operational amplifier always attempts to maintain its two inputs at the same potential, it is assured that amplitude and phase of the AC voltage applied to the guard electrode precisely agree with that of the AC voltage applied to the sensor electrode. Since, in addition to this, the output of the second operational amplifier configured as a voltage follower, which furnishes the AC voltage for the guard electrode, is of a very low impedance, it forms an ideal driver for the guard electrode, as a result of which an excellent guard effect is achieved. At the same time, forming the oscillator from two operational amplifiers results in a highly sensitive capacitive switch capable of evaluating very slight changes in the sensor capacitance which may be of the order of a few tenths of a picofarad. Despite this high sensitivity the capacitive switch exhibits due to the good guard effect an extremely low susceptance to disturbance due to soilage, formation of deposits or similar disturbing factors.

Furthermore, the capacitive switch according to the invention has a very good temperature stability since this substantially depends only on the stability of the capacitances of the capacitor in the feedback system and of the sensor electrode and the stability of the dividing factor of the voltage divider.

An advantageous modification of the capacitive switch according to the invention consists of an evaluation circuit being connected to the output of the oscillator, this evaluation circuit furnishing an output signal having a first signal value when the oscillator is not oscillating and a second signal value when the oscillator oscillates.

A further advantage of the capacitive switch according to the invention consists of it being allocated a switching hysteresis by very simple means. This is done according to a further embodiment of the invention in that the voltage divider contains a resistor which is shunted by a switch controlled by the output signal of the evaluation circuit so that it short-circuits the resistor when the oscillator is not oscillating, so as to generate a switching hysteresis due to the reduction in the dividing factor of the voltage divider when the oscillator oscillates.

BRIEF DESCRIPTION OF THE DRAWINGS

Further features and advantages will be evident from the following description of an example embodiment, the circuit diagram of which is illustrated in the sole FIGURE of the drawing.

DESCRIPTION OF THE PREFERRED EMBODIMENT

The drawing depicts schematically a capacitive probe 10 comprising a sensor electrode 11 and a guard electrode 12.

3

The two electrodes 11 and 12 are connected to an electronic arrangement 13 which has the task of triggering switching actions as a function of the capacitance of the sensor electrode 11. By way of an example it is assumed in the following that the probe 10 is used to monitor a predetermined level in a container so that the capacitance of the sensor electrode 11 depends on whether the probe 10 is covered by the material in the container or not.

The electronic arrangement 13 contains an oscillator 14 which is formed by two operational amplifiers 15 and 16. The first operational amplifier 15 is configured as a differential amplifier; it contains in its feedback circuit leading from the output to the inverting input a resistor 17 in parallel with a capacitor 18. The sensor electrode 11 is connected to the inverting input of the first operational amplifier 15. Furthermore, between the output of the first operational amplifier 15 and a conductor 19 connected to the negative terminal $-U_B$ of the operating voltage (circuit zero or ground) a voltage divider 20 is provided which is formed by the series arrangement of a resistor 21, a potentiometer 22, a resistor 23 and a resistor 24.

The second operational amplifier 16 is configured as a voltage follower (impedance converter) by its output being connected directly to its inverting input. The non-inverting input of the second operational amplifier 16 is connected to the tap of the potentiometer 22. The output of the second operational amplifier 16 is connected to the non-inverting input of the first operational amplifier 15. At this joint the guard electrode 12 is connected via a capacitor 25.

At the output of the first operational amplifier 15 a rectifier circuit 30 is furthermore connected via a capacitor 26 and a resistor 27, this rectifier circuit being formed by the parallel arrangement of a diode 31 and a resistor 32, one terminal each of which is connected to the conductor 19 whilst the other terminal is connected to the base of a transistor 33. The emitter of the transistor 33 is connected to the conductor 19, and its collector is connected via a resistor 34 to the positive terminal $+U_B$ of the operating voltage. Between the collector of the transistor 33 and the conductor 19 an integrating RC-circuit 35 is connected which consists of a resistor 36 and a capacitor 37. At the output 38 of the integrating RC-circuit 35 the input of a Schmitt trigger 39 is connected.

Between the output 38 of the RC-circuit 35 and the conductor 19 a voltage divider 40 is furthermore connected which consists of two resistors 41 and 42. To the tap 43 of the voltage divider 40 the base of the transistor 44 is connected, the collector-emitter path of which is connected in parallel with the resistor 24 of the voltage divider 20.

The two operational amplifiers 15 and 16 form a feedback system which oscillates as an oscillator when the AC gain $V_S$ of the closed loop satisfies the self-excitation condition $$V_S > 1$$

The loop gain $V_S$ equals the product of the AC gain $V_1$ of the first operational amplifier 15, the AC gain $V_2$ of the second operational amplifier 16 and the dividing factor k of the voltage divider 20:

$$V_S = V_1 \cdot V_2 \cdot k$$

In the following, the capacitance of the capacitor 18 is designated $C_{18}$ and the capacitance which the sensor electrode 11 has with respect to a counter electrode lying at the potential of the conductor 19 (circuit zero or ground) is designated $C_{11}$. In the case assumed here, i.e. monitoring a predetermined level in a container, the counter electrode may be the metallic container wall. The capacitance $C_{11}$ has a basic value $C_0$ when the probe 10 is not covered by the material in the container, and it assumes a higher value when the probe 10 is covered by the material.

The resistance value $R_{17}$ of the resistor 17 achieves the DC negative feedback of the first operational amplifier 15. The DC gain of the first operational amplifier 15 has the value 1. The resistor 17 is dimensioned such that $$R_{17} \gg 1/\omega C_{18}$$

applies where $\omega$ is the angular frequency $2\pi f$ of the oscillation to which the feedback system is excited.

The capacitors $C_{11}$ and $C_{18}$ dictate the AC gain $V_1$ of the first operational amplifier 15 as follows:

$$V_1 = 1 + C_{11}/C_{18}$$

The AC gain $V_2$ of the second operational amplifier amounts to $$V_2 = 1$$

With the dividing factor k of the voltage divider 20 the AC gain $V_S$ of the closed loop is thus $$V_S = k \cdot (1 + C_{11}/C_{18})$$

When selecting the capacitance $C_{18}$ of the capacitor 18 to be the basic value $C_0$ of the sensor capacitance:

$$C_{18} = C_0$$

and the dividing factor k of the voltage divider 20 to be the value $$k = 0.49$$

then the loop gain $V_S$ has the value $$V_S = 0.98$$

when the sensor capacitance $C_{11}$ has the basic value $C_0$, i.e. the probe 10 is not covered by the material. Since accordingly the self-excitation condition is not satisfied, the oscillator 14 does not oscillate, and no AC voltage exists at the output of the first operational amplifier 15. Therefore, no DC voltage materializes at the base of the transistor 33 and the transistor 33 remains continuously OFF. Thus, the potential $+U_B$ of the operating voltage continuously exists at the input of the Schmitt trigger 39 connected to the output 38 of the RC-circuit 35, and the binary signal provided at the output of the Schmitt trigger 39 has a first signal value which characterizes this condition of the probe 10.

With this given setting of the electronic arrangement, even a slight increase in the capacitance $C_{11}$ of the sensor electrode 11 due to the probe being covered by the material causes an increase in the loop gain $V_S$ to more than the value 1:

$$V_S > 1$$

as a result of which the oscillator 14 starts to oscillate. An AC voltage then materializes at the output of the first operational amplifier 15 which is applied via the capacitor 26 and the resistor 27 to the rectifier circuit 30. Due to the rectifying effect of the diode 31 a positive rectified voltage materializes at the resistor 32 which opens the transistor 33. Since a collector current now flows via the transistor 33, the collector voltage applied to the RC-circuit 35 and accordingly also the DC voltage smoothed by the capacitor 37 and applied to the input of the Schmitt trigger 39 decreases by the voltage drop across the resistor 34. The Schmitt trigger 39 thus assumes its other state and the binary signal provided at its output assumes its second signal value which now indicates that the probe 10 is covered by the material.

The voltage existing at the output 38 of the integrating RC-circuit 35 and applied to the input of the Schmitt trigger 39 is also available at the voltage divider 40. When the oscillator 14 is not oscillating, this voltage is high so that a voltage is applied to the base of the transistor 44 connected to the tap 43 of the voltage divider 40 which opens the transistor 44, the latter accordingly short-circuiting the resistor 24. The dividing factor k of the voltage divider 20 is determined in this state only by the resistors 21 and 23 and by the setting of the potentiometer 22. As soon as the oscillator 14 starts to oscillate and, as a result of this, the voltage at the output 38 assumes a low value, the voltage at the top 43 of the voltage divider 40 is no longer sufficient to open the transistor 44. The transistor 44 is thus closed switched OFF, and the resistor 24 is then in series with the resistor 23 in the voltage divider 20. Due to this, the dividing factor k has a higher value than when the resistor 24 is short-circuited. This results in the oscillator 14 not commencing oscillation until the capacitance $C_1$ of the sensor electrode 11 has dropped to a value which is smaller than the value which triggered the start of oscillation. Accordingly, transistor 44 produces a switching hysteresis which assures a stable behaviour of the oscillator 14 by it preventing oscillation from repeatedly starting and stopping when the sensor capacitance $C_{11}$ fluctuates about a critical value.

The trigger point for oscillation of the oscillator 14, i.e. the value of the sensor capacitance $C_{11}$ at which the oscillator 14 commences oscillation when the resistor 24 is short-circuited can be precisely set with the aid of the potentiometer 22. This setting must be made individually for each probe 10 to take into account fluctuations in fabrication and greatly differing installation conditions. The dividing factor k of the voltage divider 20 must, of course, be set in taking the switching hysteresis into account so that the sensor capacitance $C_{11}$ at which oscillation again stops, is even greater than the basic capacitance $C_0$ corresponding to the non-covered probe. Thus, the starting and stopping of oscillator 14 when the sensor capacitance $C_{11}$ fluctuates about a critical value is prevented because the oscillator 14 will not start to oscillate until the sensor capacitance $C_{11}$ exceeds a first threshold value determined by the setting of the potentiometer 22 with the transistor 44 open, resistor 24 short-circuited. As soon as the oscillator 14 starts oscillating, the transistor 44 is closed, causing resistor 24 to no longer be short-circuited, so that the oscillator 14 will not stop oscillating until the sensor capacitance $C_{11}$ drops below a second threshold value determined by the setting of the potentiometer 22 with the transistor 44 closed. The second threshold value is lower than the first threshold value.

The guard electrode 12 is connected to the non-inverting input of the first operational amplifier 15, the inverting input of which is connected to the sensor electrode 11. Since an operational amplifier attempts to maintain the voltages at its two inputs exactly the same, AC voltages exist at the two electrodes 11 and 12 which are always precisely identical in amplitude and phase. Accordingly, between the sensor electrode 11 and the guard electrode 12 there is never a difference in AC potential. Due to this, disturbance variables affecting the capacitance of the guard electrode 12 thus have no effect on the capacitance of the sensor electrode 11. Since furthermore the output of the second operational amplifier 16 configured as a voltage follower, furnishing the voltage to the guard electrode 12, is of a very low impedance, it forms an ideal driver for the guard electrode. Due to this circuit connection of the guard electrode 12 an excellent guard effect is achieved.

The transistor 44 forms a switch controlled by the output signal of the oscillator 14. It could also be replaced by any other electrically controllable switch of a known kind which, however, should be preferably a fast electronic switch.

What is claimed is:

1. A capacitive switch comprising a capacitive probe having a sensor electrode and a guard electrode, and further comprising an electronic arrangement containing an oscillator formed by two operational amplifiers, a first operational amplifier being configured as a differential amplifier, the first operational amplifier having an inverting input which is connected to the sensor electrode, a feedback circuit leading from an output of the first operational amplifier to the inverting input of the first operational amplifier, the feedback circuit includes a capacitor in parallel with a high impedance resistor, a second operational amplifier being configured as a voltage follower, the second operational amplifier having a non-inverting input receiving a portion of the output voltage of the first operational amplifier, the portion of the output voltage of the first operational amplifier is set by an adjustable voltage divider so that start and end of oscillation of the oscillator is determined by changes of the capacitance of the sensor electrode, an output of the second operational amplifier is connected to a non-inverting input of the first operational amplifier, and the guard electrode is connected to the non-inverting input of the first operational amplifier, whereby an AC voltage applied to the guard electrode has the same amplitude and phase as an AC voltage applied to the sensor electrode.

2. The capacitive switch as set forth in claim 1, wherein an evaluation circuit is connected to the output of said oscillator, said evaluation circuit furnishing an output signal having a first signal value when the oscillator is not oscillating and a second signal value when the oscillator oscillates.

3. The capacitive switch as set forth in claim 2, wherein said voltage divider contains a resistor which is shunted by a switch controlled by the output signal of said evaluation circuit so that it short-circuits the resistor when said oscillator is not oscillating, so as to generate a switching hysteresis due to the reduction in the dividing factor of the voltage divider when the oscillator oscillates.

* * * * *